United States Patent
Murakami et al.

(10) Patent No.: US 8,106,335 B2
(45) Date of Patent: Jan. 31, 2012

(54) PROCESSING APPARATUS AND HEATER UNIT (75) Inventors: Seishi Murakami, Nirasaki (JP); Kunihiro Tada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 949 days.

(21) Appl. No.: 11/631,485

(22) PCT Filed: Jul. 1, 2005

(86) PCT No.: PCT/JP2005/012217
§ 371 (c)(1),
(2), (4) Date: Jan. 4, 2007

(87) PCT Pub. No.: WO2006/004045
PCT Pub. Date: Jan. 12, 2006

(65) Prior Publication Data
US 2008/0302781 A1 Dec. 11, 2008

(30) Foreign Application Priority Data
Jul. 5, 2004 (JP) .................................. 2004-198041

(51) Int. Cl.
H05B 3/68 (2006.01)
(52) U.S. Cl. .................................. 219/444.1; 219/462.1
(58) Field of Classification Search .... 219/443.1–468.2, 219/543–548; 118/724, 725
See application file for complete search history.

(56) References Cited

U.S. PATENT DOCUMENTS

| | | | | |
|---|---|---|---|---|
| 5,616,024 A | * | 4/1997 | Nobori et al. | 432/241 |
| 6,080,970 A | * | 6/2000 | Yoshida et al. | 219/444.1 |
| 6,617,553 B2 | * | 9/2003 | Ho et al. | 219/444.1 |
| 2004/0155025 A1 | | 8/2004 | Ito et al. | |

FOREIGN PATENT DOCUMENTS

| | | |
|---|---|---|
| CN | 1320351 A | 10/2001 |
| JP | 2-73979 A | 3/1990 |
| JP | 11-74064 A | 3/1999 |
| JP | 2002-373846 A | 12/2002 |
| JP | 2003-500827 A | 1/2003 |
| JP | 2003-133032 A | 5/2003 |

OTHER PUBLICATIONS

International Search Report dated Sep. 13, 2005 including English translation (Six (6) pages).
Chinese Office Action dated Feb. 6, 2009 with English translation (eight (8) pages).

* cited by examiner

*Primary Examiner* — Sang Paik
(74) *Attorney, Agent, or Firm* — Crowell & Moring LLP

(57) ABSTRACT

A processing apparatus has a placement stage that prevents generation of a crack due to heating of an embedded heater. The placement stage (32A) on which a wafer (W) is placed has a plurality of areas (32Aa, 32Ab) so that one of the plurality of heaters is embedded independently in each of the plurality of areas. The heater (35Aa) embedded in one area (32Aa) of adjacent areas has a part ($35Aa_2$) extending in the other area (32Ab) of the adjacent areas, and the heater (35Ab) embedded in the other area (32Ab) of the adjacent areas has a part ($35Ab_2$) extending in the one area (32Aa).

11 Claims, 8 Drawing Sheets

PROCESSING APPARATUS AND HEATER UNIT

TECHNICAL FIELD

The present invention relates to processing apparatuses and, more particularly, to a processing apparatus in which a heater for heating an object to be processed is incorporated in a placement stage.

BACKGROUND ART

In a semiconductor process, chemical vapor deposition (CVD) processing is performed while heating an object to be processed, such as a silicon substrate or an LCD substrate, in many cases. It is general that heating of an object to be processed is performed by placing the object to be processed on a placement stage in which a resistance heater (linear or coil-shaped heater) is incorporated. That is, the object to be processed placed on the placement stage is heated by heating the placement stage itself from inside by the heater.

For example, in a CVD system, in order to prevent corrosion due to a reactant gas, and in order to improve temperature uniformity of a heating element, a placement stage is formed by a ceramics material, such as aluminum nitride (AlN), and a structure in which a resistance heating heater is embedded therein is used. When heating the object to be processed by heating the placement stage itself, in order to maintain in-plane uniformity of temperature of the placement stage, a plurality of heaters may be incorporated in the placement stage so as to control heating by each of the heaters in accordance with a temperature distribution (for example, refer to Patent Document 1).

Moreover, for example, in a plasma CVD apparatus which applies a process using plasma generated by using a radio-frequency, in order to generate plasma above a placement stage, an electrode for applying a radio-frequency is incorporated in the ceramic-made placement stage together with a resistance heating heater (for example, refer to Patent Document 2).

Patent Document 1: Japanese Laid-Open Patent Application No. 2003-500827
Patent Document 2: Japanese Laid-Open Patent Application No. 11-74064

In the placement stage in which a resistance heating heater is embedded in a ceramic material, there may be a problem in that an excessive internal stress is generated in the ceramic material due to a temperature difference according to heating by the heater and cracking occurs in the ceramic material.

Figure 1:
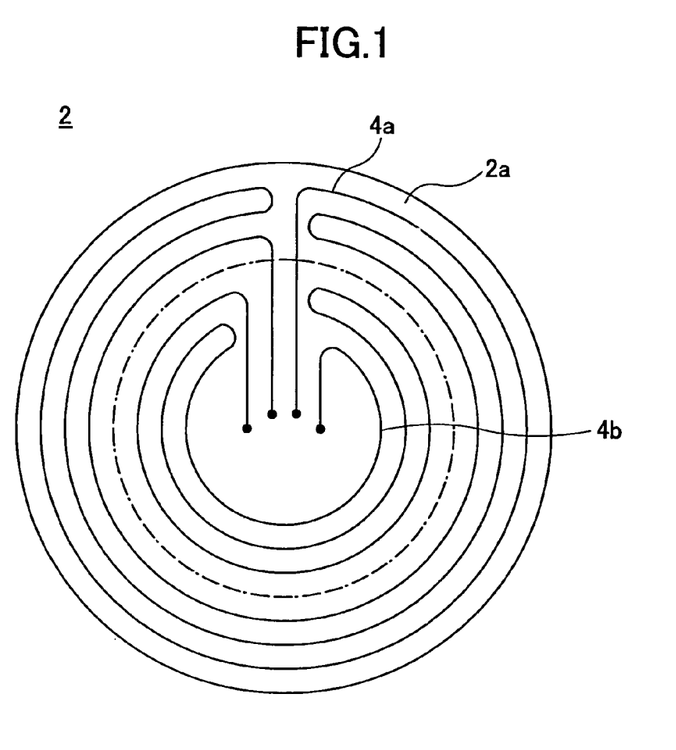
FIG. 1 is a plan view showing a conventional placement stage.
Figure 2:
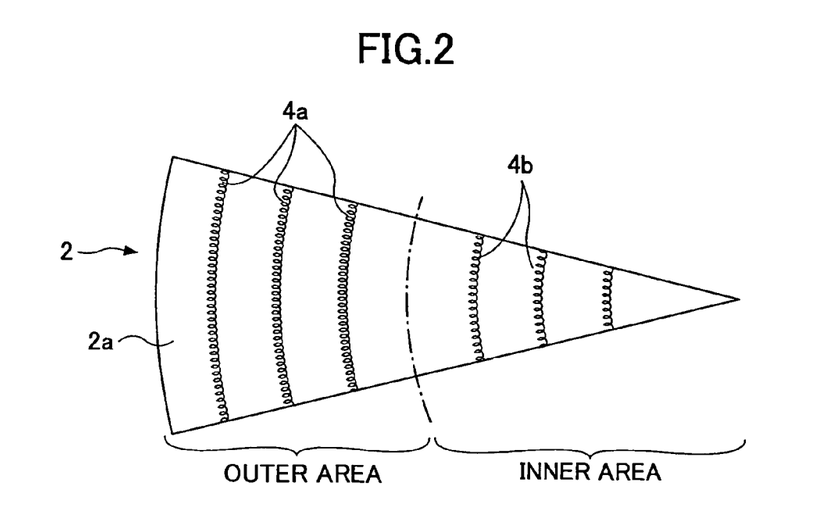
FIG. 2 is an enlarged view of a part of the placement stage shown in FIG. 1.
Figure 3:
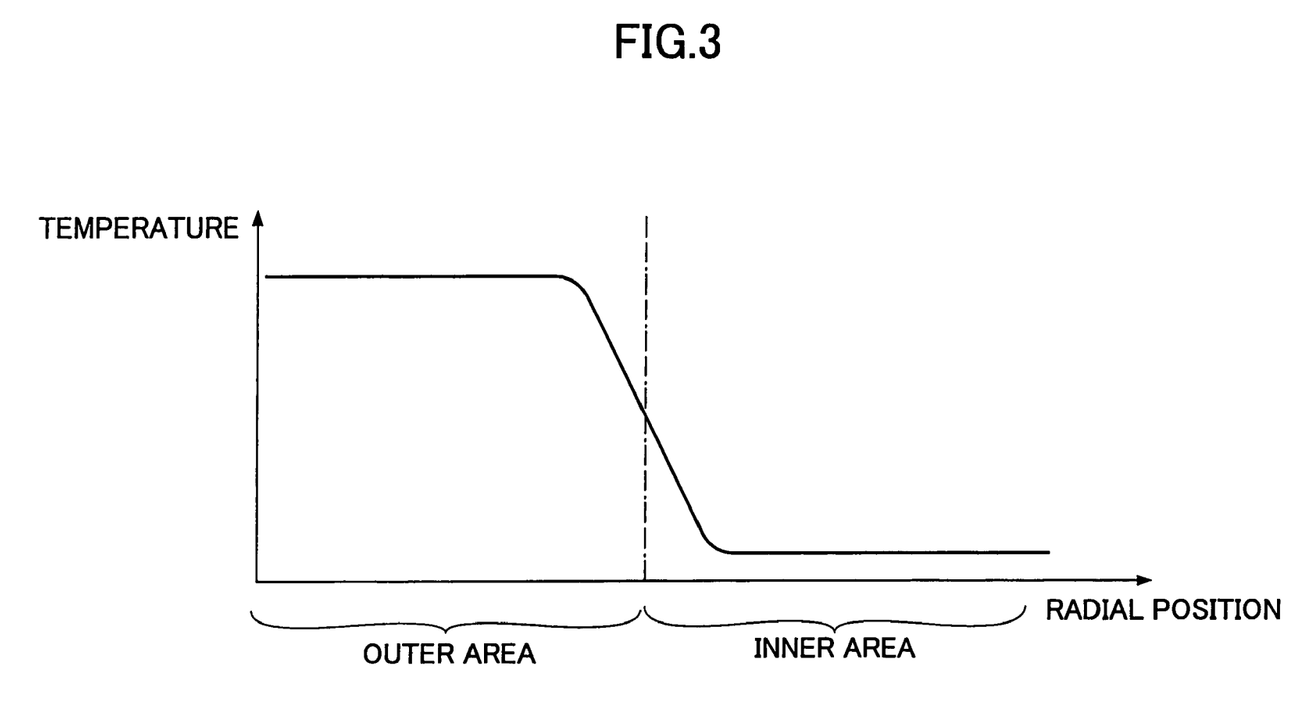
FIG. 3 is a graph showing a temperature distribution of a heater embedded in the placement stage shown in FIG. 1.

For example, in order to maintain in-plane uniformity of temperature of a placement stage, the placement stage may be divided into a plurality of areas in a radial direction and a heater is provided independently in each area so as to perform a control and adjustment of the temperature of the placement surface of the placement stage. FIG. 1 is a plan view showing arrangement of heaters when the heaters are independently provided to each of divided two areas, an inner area and an outer area. Additionally, FIG. 2 is a plan view showing a part of the placement stage shown in FIG. 1 in enlargement.

The placement stage 2 is a disk-shaped ceramic material having a circular surface (placement surface 2a) matching an object to be processed, such as a wafer, and a heater 4 embedded in the interior. The placement stage 2 is divided into a plural number in a radial direction (in FIG. 1, divided into two, an outer area and an inner area), and a heater is independently provided to each area.

Both ends of a heater 4a provided in the outer area are located almost at the center of the placement stage 2, and the heater 4a extends outward in a radial direction and then enters the outer area and extends along a plurality of circumferences by being folded in the outer area. Also, both ends of a heater 4b are located almost at the center of the placement stage 2 and extends along a plurality of circumferences by being folded in the inner area. It should be noted that although the heater is drawn as a linear line in FIG. 1, it is actually a densely-wound coil form.

When a wafer, which is an object to be processed, is placed on the placement stage 2 such as shown in FIG. 1 and is heated, there is a tendency that the outer area is lower in temperature than the inner area. This is for the reason that heat goes away from the inner side to the outer side (a lower temperature side). Accordingly, there may be a case where the outer area is heated stronger than the inner area. In such as case, a temperature difference is generated between the inner area and the outer area of the placement stage 2, which generates a temperature slope near the boundary (indicated by a single-dashed chain line). When this temperature slope becomes larger than an allowable temperature slope of the ceramic material, which is the material of placement stage 2, an excessive internal stress (a thermal stress due to a temperature difference) is generated in the ceramic material, which may cause a crack generated in the placement stage with a minute defect formed during processing of a ceramic material. Ceramic materials have a small coefficient of thermal expansion but particularly sensitive to a temperature difference, and cracking of a placement stage formed by a ceramic material in which a heater is incorporated is a problem to be solved.

Moreover, when the placement stage as mentioned above is used for a processing apparatus according to plasma, there is a case where an electrode is embedded in the placement stage together with a heater. The electrode is for applying a radio frequency to a space above the placement stage, and it is general that the electrode is provided in an upper side of the heater (a side closer to the placement surface) inside the placement stage. As the material for forming the electrode, when, for example, the placement stage is formed by a ceramic material such as aluminum nitride (AlN), there is used in many cases molybdenum (Mo) which has a coefficient of thermal expansion close to that of AlN. The electrode may be in a disk-shape or a metal foil form, and may also be in a mesh-shape so as to be easily embedded in the ceramic material.

Figure 4:
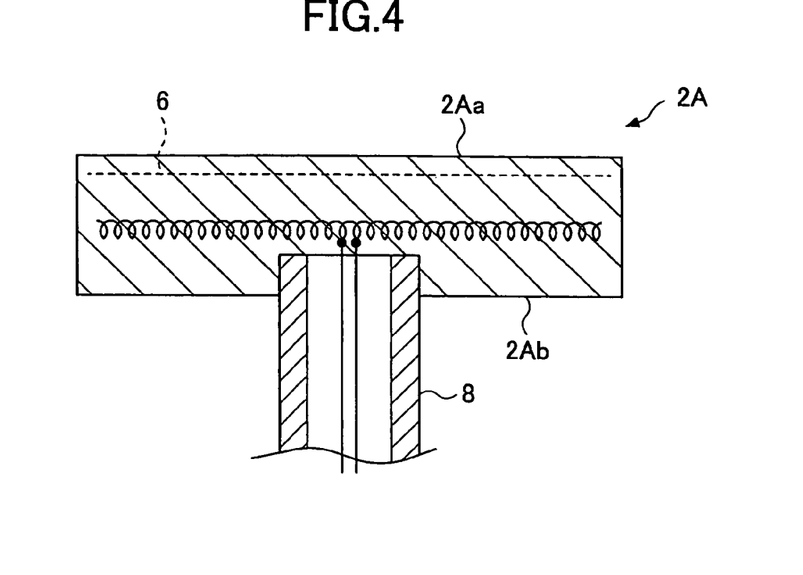
FIG. 4 is a cross-sectional view showing another example of a conventional placement stage.

FIG. 4 is a cross-sectional view showing an outline structure of a conventional placement stage 2A in which an electrode 6 is embedded. A support member 8 for supporting the placement stage 2A and fixing to a processing container is attached at a central portion of the backside of the placement stage 2A.

Figure 5:
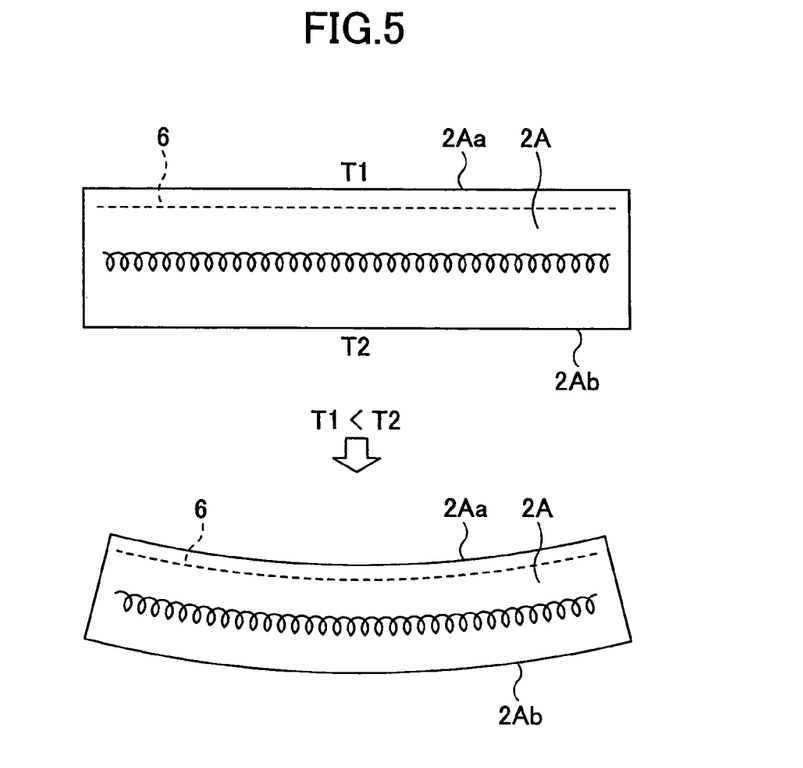
FIG. 5 is an illustration for explaining a variation of the placement stage shown in FIG. 4.

In the placement stage 2A, a portion where the metal-made electrode 6 is embedded in the ceramic material is not easily deformed since the ceramic material is reinforced by the electrode 6. Here, supposing that a temperature of the front surface side of the placement stage 2A is set to T1 and a temperature of the back surface side is T2, there is a case where T2 is greater than T1 (T1<T2). For example, the back surface of the placement stage faces a bottom surface of the process chamber, and when a radiation heat emitted from the back surface of the placement stage is reflected by the bottom surface of the process chamber and returns to the back surface of the placement stage, T2 is larger than T1. In such a case, an internal stress is generated in the placement stage due to a temperature difference between the front and back surfaces of the placement stage 2A such that it is bowed and deformed as shown in FIG. 5. There is a problem in that cracking occurs near the central portion (near the portion where the support member is attached) of the placement stage due to such an internal stress.

SUMMARY OF THE INVENTION

It is a general aspect of the disclosure to provide an improved and useful processing apparatus in which the above-mentioned problems are eliminated.

A more specific aspect of the disclosure is to provide a processing apparatus having a placement stage which prevents generation of a crack due to heat of a heater embedded, and a heater unit provided in the processing apparatus.

In order to achieve the above-mentioned aspects, there is provided a processing apparatus for applying a process while heating an object to be processed, comprising: a processing container; a placement stage arranged in the processing container and on which said object to be processed is placed; and a plurality of heaters embedded in the placement stage for heating said object to be processed placed by heating said placement stage, wherein said placement stage has a plurality of areas so that one of said plurality of heaters is embedded independently in each of the plurality of areas, and said heater embedded in one of adjacent areas has a part extending in the other of the adjacent areas, and said heater embedded in the other of the adjacent areas has a part extending in said one of the adjacent areas.

In the above-mentioned processing apparatus, it is preferable that at least a part of the two heaters in said adjacent areas extend by reciprocating between said adjacent areas while maintaining a positional relationship so as to be close to but not in contact with each other. Additionally, said placement stage may be disk-shaped, and said plurality of areas may be concentric areas divided in a radial direction of the placement stage, and the heaters embedded in an outer area and the heaters embedded in an inner area of adjacent areas of the concentric areas may have parts that alternately enters in a vicinity of a boundary between the outer area and the inner area. The shape of the placement stage may be a quadrangle (a square or a rectangular) or a polygon.

Additionally, in the above-mentioned processing apparatus, said placement stage may be made of a ceramic material, and said heaters may be made of a resistance heating metal of a linear-shape or coil-shape. Said ceramic material may be selected from a group consisting of AlN, $Al_2O_3$, SiC and $SiO_2$. Additionally, said heaters may be printed pattern heaters. Further, said resistance heating metal may be a metal selected from among elementary substances of molybdenum, vanadium, chrome, manganese, niobium, tantalum, nickel and tungsten and an alloy of the aforementioned.

Additionally, there is provided according to another aspect of the disclosure a heater unit for heating an object to be processed, wherein the heater unit has a plurality of areas and a heater is independently embedded in each of the plurality of areas, and said heater embedded in one of adjacent areas has a part extending in the other of the adjacent areas, and said heater embedded in the other of the adjacent areas has a part extending in said one of the adjacent areas.

Further, there is provided according to another aspect of the disclosure a processing apparatus for processing while heating an object to be processed, comprising: a processing container; a placement stage arranged in the processing container and on which said object to be processed is placed; and a heater embedded in the placement stage for heating said object to be processed placed by heating said placement stage, wherein said heater is arranged in a center between a front surface and a back surface of said placement stage, an electrode is embedded along the front surface, and a reinforcing member formed of the same material as the electrode is embedded along the back surface.

In the above-mentioned processing apparatus, it is preferable that said electrode and said reinforcing member are connected so as to be at the same potential. Additionally, it is preferable that a side surface reinforcing member formed of the same material as said electrode is embedded along a side surface of said placement stage. Further, it is preferable that said replacement stage is made of a ceramic material and said heater is made of a resistance heating metal of a linear or coil-shape, and said electrode and said reinforcing member are formed of a metal mesh. Additionally, said ceramic material may be selected from a group consisting of AlN, $Al_2O_3$, SiC and $SiO_2$. Additionally, said resistance heating metal and said metal mesh may be selected from among elementary substances of molybdenum, vanadium, chrome, manganese, niobium, tantalum, nickel and tungsten and an alloy of the aforementioned.

Additionally, there is provided according to yet another aspect of the disclosure a heater unit for heating an object to be processed, wherein the heater unit has a front surface on which said object to be processed is placed and a back surface opposite to the front surface, and comprises: a heater arranged in a center between the front surface and the back surface; an electrode embedded along said front surface; and a reinforcing member embedded along said back surface and formed of the same material as the electrode.

The above-mentioned processing apparatus according to the disclosure can realize a placement stage, even when a temperature control is performed independently by dividing a placement stage into a plurality of areas, in which generation of a crack of the placement stage due to a temperature difference of each area is suppressed, and a processing apparatus having such a placement stage. Since the above-mentioned placement stage functions as a heater for heating an object to be processed, the placement stage alone is formed as a heater unit for a processing apparatus.

Moreover, by using a placement stage in which a reinforce member is embedded on the back surface side, the processing apparatus having the placement stage in which generation of bowing deformation or a crack due to a temperature difference between the front side and back side of the placement stage is suppressed can be realized. Here, since the above-mentioned placement stage functions as a heater for heating a wafer, the placement stage alone is formed as a heater unit for the processing apparatus.

Other aspects, features and advantages of embodiments of the present invention will become more apparent from the following detailed description when read in conjunction with the accompanying drawings.

EXPLANATION OF REFERENCE SIGNS

3 TiN film deposition apparatus
31 chamber
32, 32A, 32B susceptor
32Aa outer area
32Ab inner area
35, 35Aa, 35Ab heater
$35Aa_1$, $35Aa_2$, $35Ab_1$, $35Ab_2$ part of heater
40 showerhead
50 gas supply mechanism
69 wafer support pin
W wafer

DETAILED DESCRIPTION OF PREFERRED EMBODIMENTS OF THE PRESENT INVENTION

Next, a description will be given, with reference to the drawings, of embodiments of the present invention.

Figure 6:
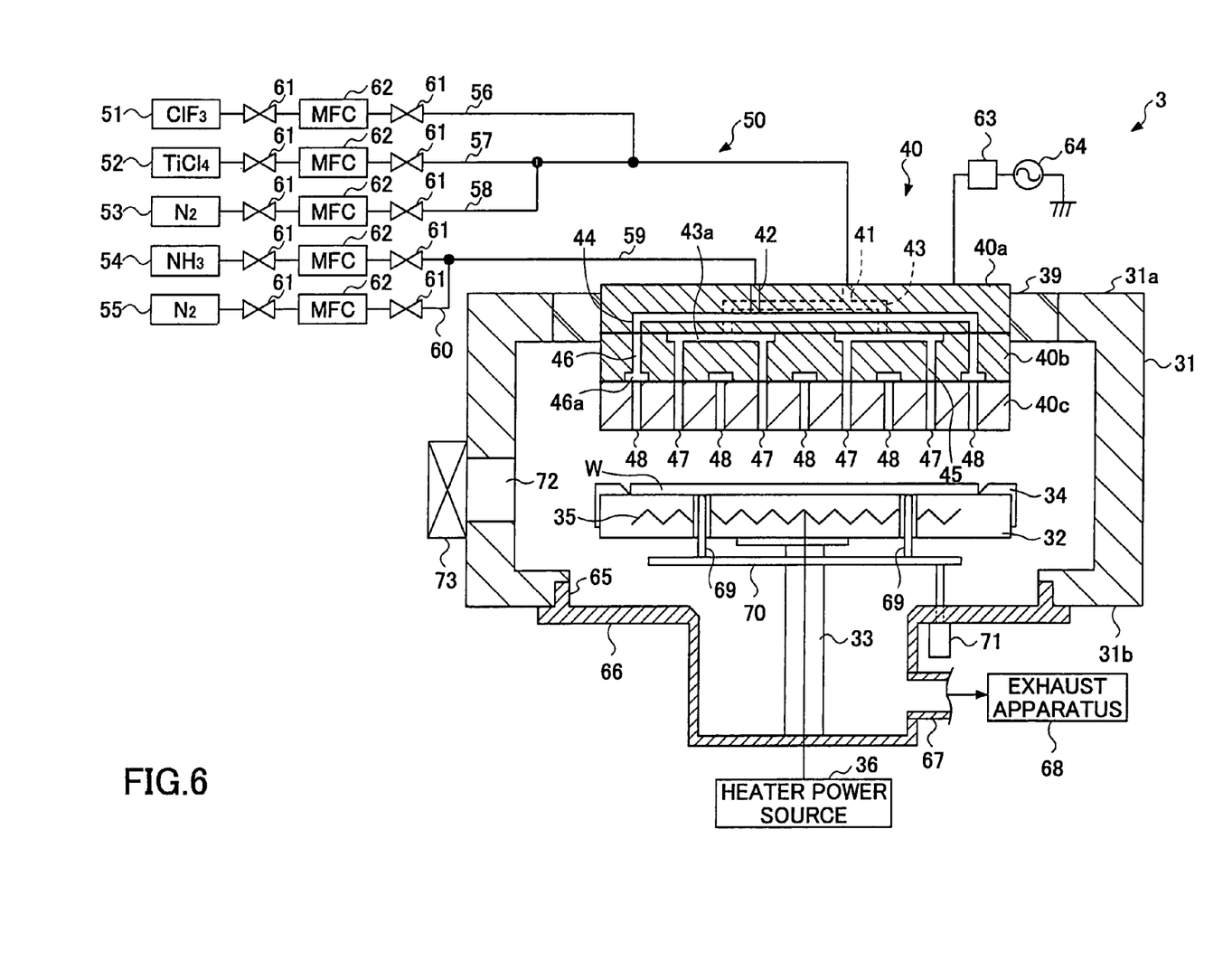
FIG. 6 is a cross-sectional view of a processing apparatus to which an embodiment of the present invention is applied.

First, a description will be given, with reference to FIG. 6, of a CVD film deposition apparatus as an example of a processing apparatus used for carrying out an embodiment of the present invention. FIG. 6 is a cross-sectional view showing a CVD film deposition apparatus to which an embodiment of the present invention is applicable. The CVD film deposition apparatus shown in FIG. 6 is an apparatus for depositing a TiN film on a wafer W, which is an object to be processed, and is hereinafter referred to as a TiN film deposition apparatus. It should be noted that embodiments of the present invention relate to a placement stage on which a wafer is placed in the TiN film deposition apparatus and, particularly, to a placement stage having a structure in which a heater is incorporated so as to heat the wafer. However, embodiments of the present invention are not limited to a CVD processing apparatus such as a TiN film deposition apparatus or a plasma CVD apparatus, and is applicable to other various processing apparatuses having a placement stage in which a heater is incorporated.

The TiN film deposition apparatus 3 shown in FIG. 6 has a chamber 31, which is a process chamber and has a generally cylindrical shape configured to be airtight, and arranged therein is a susceptor 32 as a placement stage for supporting the wafer W, which is an object to be heated, horizontally in a state where the susceptor is supported by a cylindrical support member 33 having at a center lower part thereof. A guide ring 34 is provided on a circumferential edge part of the susceptor 32 so as to guide the wafer W. Additionally, a heater 35 is embedded in the susceptor 32 so that the wafer W can be heated at a predetermined temperature by supplying an electric power to the heater 35 from a heater power source 36. It should be noted that the susceptor 32 is formed of, for example, a ceramic material such as AlN so that a ceramic heater is constituted in a state where the heater 35 is embedded in the ceramic material.

A showerhead 40 is provided to a ceiling wall 31a of the chamber 31 via an insulating member 39. The showerhead 40 comprises an upper stage block body 40a, a middle stage block body 40b and a lower stage block body 40c. Alternately, formed in the lower stage block body 40c are discharge ports 47 and 48 which discharge gases. A first gas introducing port 41 and a second gas introducing port 42 are formed on an upper surface of the upper stage block body 40a. Many gas passages 43 are branched from the first gas introducing port 41 in the upper stage block member 40a. Gas passages 45 are formed in the middle stage block body 40b so that the above-mentioned gas passages 43 communicate with these gas passages 45 through communication passages 43a which extend horizontally. Further, the gas passages 45 communicate with discharge ports 47 of the lower stage block body 40c. Additionally, many gas passages 44 are branched from the second gas introducing port 42 in the upper stage block body 40a. Gas passages 46 are formed in the middle stage block body 40b so that the above-mentioned gas passages 44 communicate with these gas passages 46. Further, the gas passages 46 are connected to communication passages 46a extending horizontally in the middle stage block body 40b so that the communication passages 46a communicate with many discharge ports 48 of the lower stage block body 40c. Then, the above-mentioned first and second gas introducing ports 41 and 42 are connected to a gas line of a gas supply mechanism 50.

The gas supply mechanism 50 comprises a $ClF_3$ gas supply source 51 which supplies a $ClF_3$ gas which is a cleaning gas, a $TiCl_4$ gas supply source 52 which supplies a $TiCl_4$ gas which is a Ti containing gas, a first $N_2$ gas supply source 53 and a second $N_2$ gas supply source 55 which supply an $N_2$ gas and an $NH_3$ gas supply source 54 which supplies an $NH_3$ gas.

A $ClF_3$ gas supply line 56 is connected to the $ClF_3$ gas supply source 51, a $TiCl_4$ gas supply line 57 to the $TiCl_4$ gas supply source 52, a first $N_2$ gas supply line 58 to the first $N_2$ gas supply source 53, an $NH_3$ gas supply line 59 to the $NH_3$ gas supply source 54, and a second $N_2$ gas supply line 60 to the second $N_2$ gas supply source 55, respectively. Then, a mass-flow controller 62 and two valves 61 sandwiching the mass-flow controller 62 are provided to each gas supply line. Said first gas introducing port 41 is connected with the $TiCl_4$ gas supply line 57 extending from the $TiCl_4$ gas supply source 52, and the $TiCl_4$ gas supply line 57 is connected with the $ClF_3$ gas supply line 56 extending from the $ClF_3$ gas supply source 51 and the first $N_2$ gas supply line 58 extending from the $N_2$ gas supply source 53. Additionally, said second gas introducing port 42 is connected with the $NH_3$ gas supply line 59 extending from the $NH_3$ gas supply source 54, and the $NH_3$ gas supply line 59 is connected with the second $N_2$ gas supply line 60 extending from the second $N_2$ gas supply source 55.

At the time of a film deposition process, $TiCl_4$ gas from the $TiCl_4$ gas supply source 52 reaches inside the showerhead 40 from the first gas introducing port 41 of the showerhead 40 through the $TiCl_4$ gas supply line 57 together with $N_2$ gas from the first N2 gas supply source 53, and is discharged into the chamber 31 from the discharge port 47 through the gas passages 43 and 45. On the other hand, $NH_3$ gas from the $NH_3$ gas supply source 54 reaches inside the showerhead 40 from the second gas introducing port 42 of the showerhead 40 through the $NH_3$ gas supply line 59 together with $N_2$ gas from the second $N_2$ gas supply source 55, and is discharged into the chamber 31 from the discharge port 48 through the gas passages 44 and 46. That is, the showerhead 40 is of a post-mix type in which TiCl$_4$ gas and NH$_3$ gas are completely independently supplied into the chamber 31, and thus, these are mixed and a reaction occurs after being discharged.

The showerhead 40 is connected with a radio frequency power source 64 through a matching unit 63 so as to be configured to supply a radio frequency electric power to the showerhead 40 from the radio frequency power source 64 if necessary. Although the radio frequency power source 64 is not needed usually, it is possible to deposit a film by changing the gas supplied inside the chamber 31 through the showerhead 40 into plasma by supplying a radio frequency electric power from the radio frequency power source 64 when reactivity of a film deposition reaction is desired to be improved.

A circular hole 65 is formed in the center portion of a bottom wall 31$b$ of the chamber 31, and an exhaust chamber 66 protruding downward to cover the hole 65 is provided to the bottom wall 31$b$. An exhaust pipe 67 is connected to a side surface of the exhaust chamber 66, and an exhaust apparatus 68 is connected to the exhaust pipe 67. Then, it is possible to reduce a pressure to a predetermined degree of vacuum inside the chamber 31 by actuating the exhaust apparatus 68.

The susceptor 32 functioning as a placement stage is provided with three wafer support pins 69 (only two shown in the figure), which is for supporting and moving upward and downward the wafer W, so as to protrude and intrude with respect to the surface of the susceptor 32, and these wafer support pins 69 are fixed to a support plate 70. The wafer support pins 69 are caused to move upward and downward by a drive mechanism 71 such as an air cylinder through the support plate 70.

Moreover, the side wall of the chamber 31 is provided with a carry in and out port 72 for carrying in and out the wafer W and a gate valve 73 for opening and closing the carry in and out port 72.

In the TiN film deposition apparatus 3 having the above-mentioned structure, a CVD process is performed on the wafer while heating the susceptor 32 by supplying an electric power to the heater of the susceptor 32 in a state where the wafer W is placed on the susceptor 32, which is a placement stage, so as to deposit a TiN film on the wafer W. A heating temperature of the wafer W at this CVD process is, for example, 400-700° C., and the placed wafer W is heated about 350-650° C. by heating the susceptor 32 itself at 400-700° C.

It should be noted that although it is not always needed to change the gas into plasma, at the time of film deposition, by supplying a radio frequency electric power from the radio frequency power source 64, the gas may be changed into plasma by a radio frequency electric power in order to improve reactivity. In this case, a radio frequency electric power of about 450 kHz-60 MHz and about 200-1000 W may be supplied, for example. Under this condition, the temperature of the wafer W is set to 300-700° C. since the reactivity of the gas is high.

Figure 7:
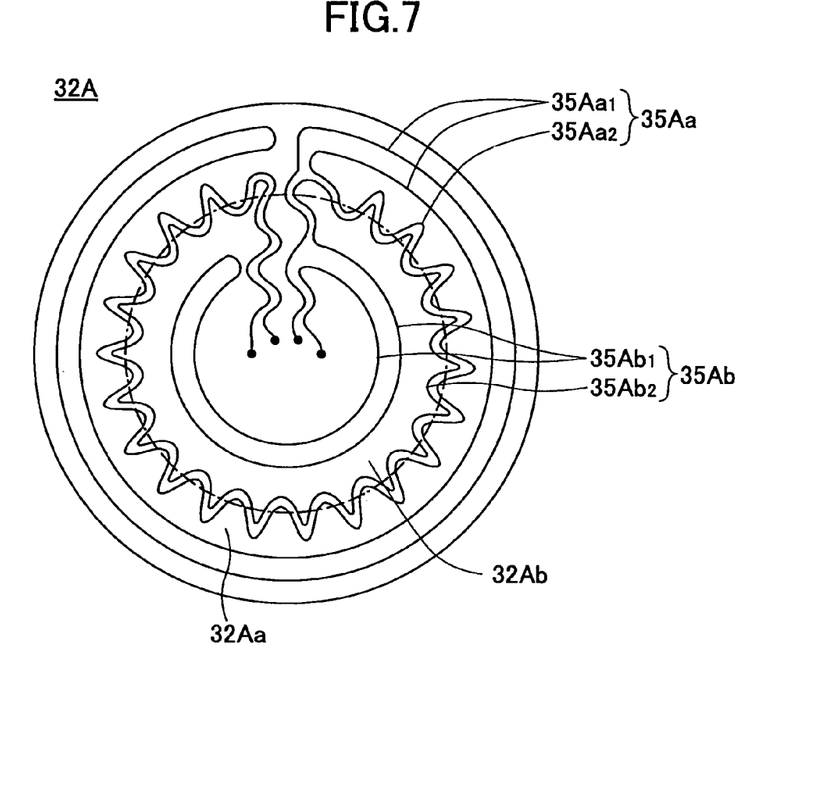
FIG. 7 is a plan view of a placement stage according to a first embodiment of the present invention in which a heater is provided.

Next, a description will be given of a heater unit of a first embodiment of the present invention. The heater unit of the present invention has features in an arrangement of the heater 35 embedded in the susceptor 32 as the placement stage of the above-mentioned processing apparatus. FIG. 7 is a plan view showing the susceptor 32A as a heater unit according to an embodiment of the present invention, which shows an internal heater 35A in a see-through state.

The susceptor 32A is formed as a disk-shaped member made of a ceramic material such as AlN, Al$_2$O$_3$, SiC or SiO$_2$. The susceptor 32A is divided into two, an outer area 32Aa and an inner area 32Ab, in a radial direction thereof, and heaters 35Aa and 35Ab are independently embedded in the respective areas. As for a material of each of the heaters 35Aa and 35Ab, for example, a single substance of molybdenum, vanadium, chromium, manganese, niobium, tantalum, nickel or tungsten, or an alloy of those can be used as a resistance heating metal.

Both ends of each of the heaters 35Aa and 35Ab are located almost at the center portion of the susceptor, and are connected to power supply lines extending inside the hollow support member 33. Then, an electric power is supplied independently from the heater power source 36 to each of the heaters 35Aa and 35Ab. Accordingly, a temperature of each of the outer area 32Aa and the inner area 32Ab of the susceptor 32A can be controlled independently.

Here, in the present embodiment, the heater 35Aa provided in the outer area 32Aa has an outer circumferential portion 35Aa$_1$ provided in the outer area 32Aa and an inner portion 35Aa$_2$ winding in a pectinate form. On the other hand, the heater 35Ab provided in the inner area 32Ab has an inner circumferential portion 35Ab$_1$ provided in the inner area 32Ab and an outer portion 35Ab$_2$ winding in a pectinate form.

When a circular member such as the susceptor 32A is heated, an amount of heat radiation at a peripheral portion is larger than a center portion since the peripheral portion (especially an outer circumferential edge) has a larger surface area (thermal solid angle) per unit volume than the center portion, and, thus, a heat radiation from the peripheral portion is larger than that of the center portion. Thus, it is necessary to heat the outer area 32Aa stronger than the inner area 32Ab. Accordingly, since the outer area 32Aa is heated stronger than the inner area 32Ab, a temperature difference is generated between the outer area 32Aa and the inner area 32Ab. If this temperature difference is large, an excessive thermal stress is generated in a portion between outer area 32Aa and the inner area 32Ab, which may generate a problem that the susceptor 32A cracks at this portion.

Figure 8:
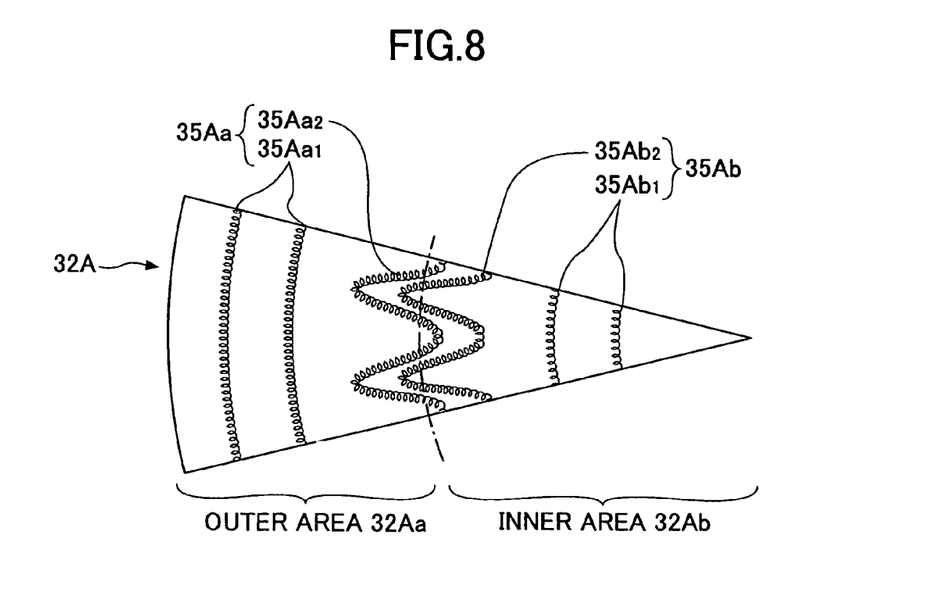
FIG. 8 is an enlarged view of a part of the placement stage shown in FIG. 7.
Figure 9:
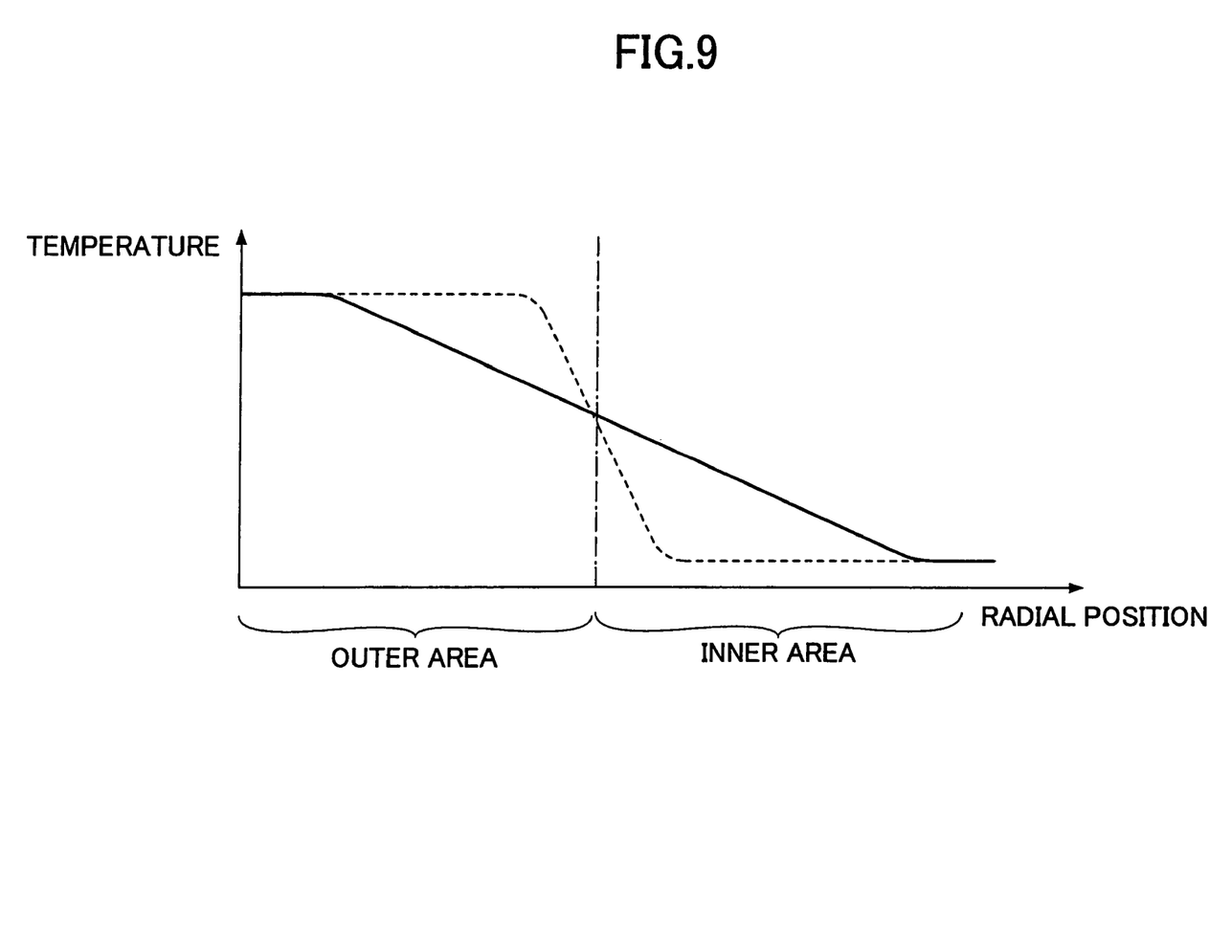
FIG. 9 is a graph showing a temperature distribution of a heater embedded in the placement stage shown in FIG. 7.

Thus, in the present embodiment, in the vicinity of the boundary between the outer area 32Aa and the inner area 32Ab, as shown in FIG. 7 and FIG. 8, the portion 35Aa$_2$ of the heater 35Aa of the outer area 32Aa and the portion 35Ab$_2$ of the heater 35Ab of the inner area 32Ab are arranged in an alternately penetrating form. In the example shown in FIG. 7 and FIG. 8, the portion 35Aa$_2$ of the heater 35Aa of the outer area 32Aa and the portion 35Ab$_2$ of the heater 35Ab of the inner area 32Ab are provided in parallel to each other while bending in a sinusoidal form. Accordingly, if a temperature of the heater 35Aa is set and controlled higher than a temperature of the heater 35Ab in the vicinity of the boundary between the outer area 32Aa and the inner area 32Ab, a temperature gradient in the vicinity of the boundary can be gentle as shown in FIG. 9. It should be noted that the portion 35Aa$_2$ of the heater 35Aa of the outer area 32Aa and the portion 35Ab$_2$ of the heater 35Ab of the inner area 32Ab may be provided in the same plane in the susceptor 32A, or provided in different planes (that is, different positions in the direction of thickness of the susceptor 32A).

An internal stress (thermal stress) of the susceptor depends on the temperature gradient (temperature difference), and the internal stress is larger as the temperature gradient is steeper. Accordingly, the internal stress can be reduced by making the temperature gradient gentle, and, as a result, generation of cracking of the susceptor 32A due to the internal stress can be suppressed. It should be noted that, in FIG. 9, a solid line indicates a temperature gradient of the susceptor 32A obtained by the heater form according to the present embodiment, and a dashed line indicates a temperature gradient obtained by a conventional heater form and arrangement.

It should be noted that although the heaters 35Aa and 35Ab are resistance heating wire heaters of a linear or coil form in the above-mentioned embodiment, they can be print heaters formed by using a printed circuit technique. Thereby, the alternately penetrating form (positional relationship of close to but not in contact) of the portions 35Aa$_2$ and 35Ab$_2$ of those heaters can be formed easily.

As mentioned above, by using the susceptor according to the above-mentioned embodiment, even when the susceptor is divided into a plurality of areas and a temperature control is performed independently, a placement stage in which generation of cracking of the susceptor due to an internal stress caused by a temperature difference of the areas is suppressed and a processing apparatus having such a placement stage can be realized. Here, the above-mentioned susceptor or placement stage can be formed as a heater unit for a processing apparatus as a placement stage alone since it functions as a heater for heating a wafer.

Figure 10:
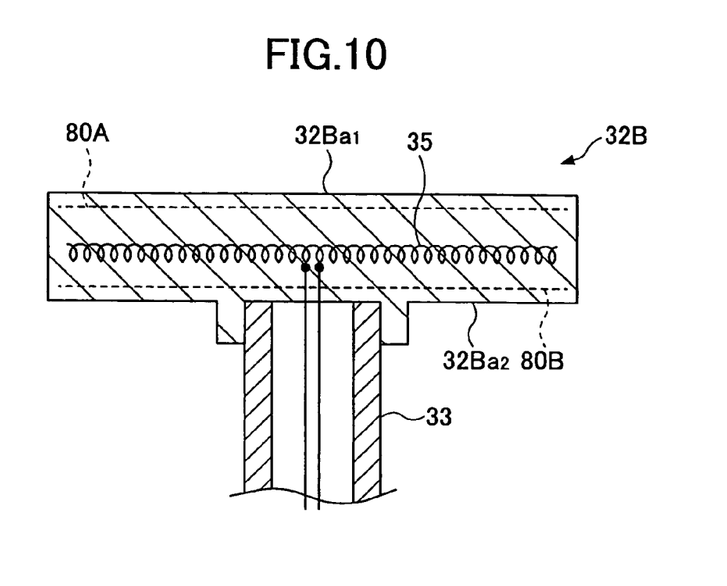
FIG. 10 is a cross-sectional view of a placement stage according to a second embodiment of the present invention in which a heater is embedded.

Next, a description will be given of a heater unit according to a second embodiment of the present invention. The heater unit according to the second embodiment of the present invention is one in which electrodes are embedded on both sides of the front surface side and the back surface side of the susceptor 32 as the above-mentioned placement stage. FIG. 10 is a cross-sectional view showing a susceptor 32B as a placement stage in which a heater unit according to a second embodiment of the present invention is provided in the chamber of the processing apparatus.

In the susceptor 32B shown in FIG. 10, the heater 35 is embedded in a circular ceramic material. The heater 35 is arranged in the center of the susceptor 32B in a direction of the thickness. Additionally, a mesh-form electrode 80A is embedded in the vicinity of a surface (placement surface) 32Ba$_1$ of the susceptor 32B, and a reinforcing member 80B formed of the same material and in generally the same form as the electrode 80A is embedded in the vicinity of a back surface 32Ba$_2$ of the susceptor 32B. If the processing apparatus is a plasma CVD apparatus, the electrode 80A on the front surface side functions as an electrode for generating plasma. In this case the electrode 80A is set at a ground potential.

On the other hand, the reinforcing member 80B does not necessarily serve as an electrode, and functions as a reinforcing member of the susceptor 32B. That is, the electrode 80A and the reinforcing member 80B are formed of metal mesh such as molybdenum so as to function as reinforcing members that relax an internal stress in the ceramic material when embedded in the ceramic material similar to a composite material. As for the metal mesh forming the electrode 80A and the reinforcing member 80B, a single substance of vanadium, chromium, manganese, niobium, tantalum or tungsten, or an alloy of these may be used other than molybdenum.

Figure 11:
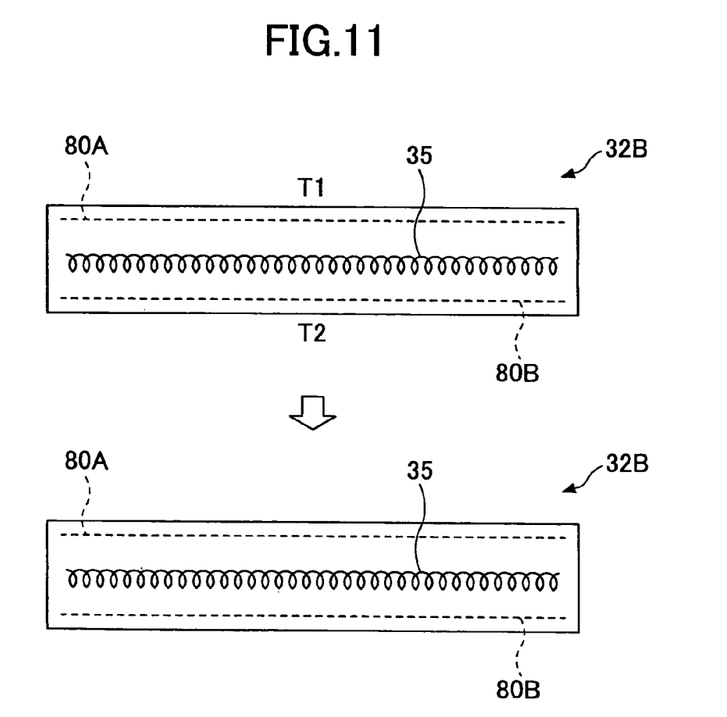
FIG. 11 is an illustration for explaining a variation of the placement stage shown in FIG. 10.

If only the electrode 80A is embedded on the front surface 32Ba$_1$ side of the susceptor, a state is set where only the front surface side is reinforced, and strength and thermal expansion are different between the front surface and the back surface. Thereby, an internal stress due to heating of the susceptor is also different between the front side and the back side, which results in generation of a stress bowing the susceptor. However, by embedding the electrode 80A and the reinforcing member 80B on the front side and the back side of the susceptor 32B in generally symmetry such as in the present embodiment, generation of a stress bowing the susceptor 32B is suppressed. That is, when the susceptor 32B is heated, it only expands in a radial direction as shown in FIG. 11. Accordingly, generation of cracking of the susceptor caused by the internal stress due to heating of the heater 35 can be suppressed.

Figure 12:
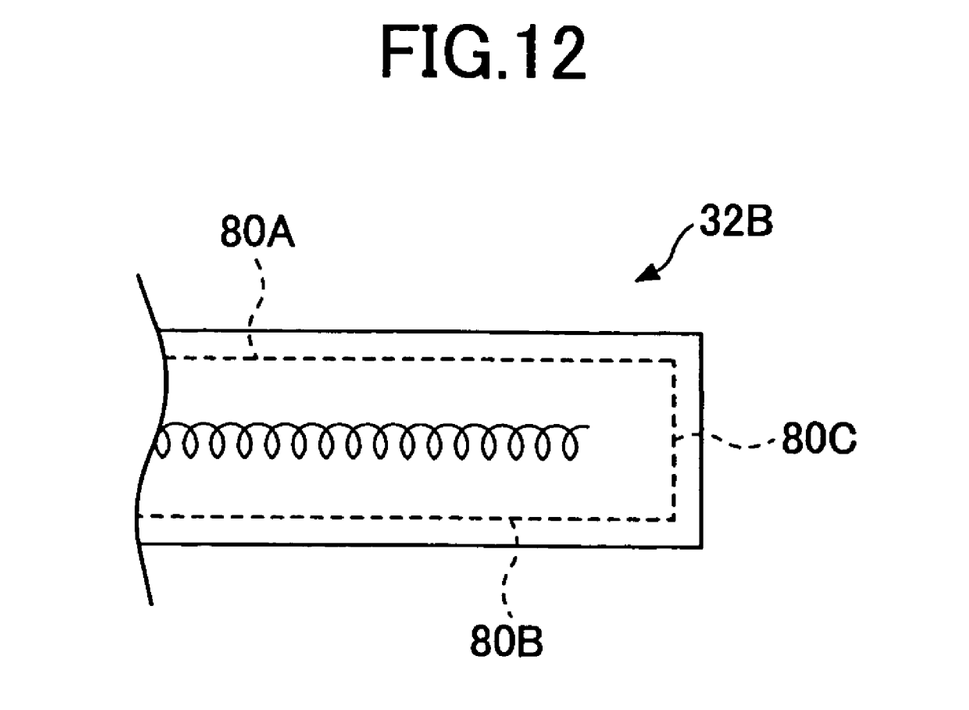
FIG. 12 is a cross-sectional view of a part of a variation of the replacement stage shown in FIG. 10.

It should be noted that although the reinforcing member 80B does not necessarily function as an electrode, an effect of shielding an interior (heater 35) of the susceptor 32B by setting at a ground potential similar to the electrode 80A. For example, if a noise from a plasma generated portion is reflected at a bottom of the chamber and enters on the back side of the susceptor 32B, it can be shielded so as to prevent the noise from entering. Additionally, as shown in FIG. 12, by embedding a side reinforcing member 80C also in the vicinity of the side surface of the susceptor 32B and setting at a ground potential, the interior of the susceptor can be completely shielded. According to the above-mentioned shield effect, RF noise is prevented from entering a TC and the heater in the susceptor. If RF noise enters the TC and the heater in the susceptor, a heater control circuit may malfunction or the heater control circuit may be damaged or failed due to an excessive current flowing in the heater, but the heater control circuit can be protected by preventing entrance of a noise according to the above-mentioned shield effect of the reinforcing members.

As mentioned above, by using the susceptor 32B according to the above-mentioned embodiment, the placement stage in which generation of bowing deformation or cracking of the susceptor due to a temperature difference between the front and back of the susceptor is suppressed, and the processing apparatus having such a placement stage can be realized. Here, since the above-mentioned susceptor or placement stage functions as a heater for heating a wafer, the placement stage alone is formed as a heater unit for a processing apparatus.

The disclosure is not limited to the specifically disclosed embodiments, and variations and modifications may be made without departing from the scope of the disclosure.

The disclosure is applicable to processing apparatuses, especially, to a processing apparatus incorporating a heater for heating an object to be processed.

The invention claimed is:
1. A processing apparatus for applying a process while heating an object to be processed, comprising:
   a processing container;
   a placement stage arranged in the processing container and on which said object to be processed is placed; and
   a plurality of heaters embedded within a single plane of the placement stage for heating said object to be processed placed by heating said placement stage,
   wherein said placement stage has a plurality of areas so that one of said plurality of heaters is embedded independently in each of the plurality of areas, and said heater embedded in one of adjacent areas has a part extending in the other of the adjacent areas,
   wherein said heater embedded in the other of the adjacent areas has a part extending in said one of the adjacent areas, and
   wherein at least a part of the two heaters in said adjacent areas extend by reciprocating between said adjacent areas while maintaining a positional relationship so as to be close to but not in contact with each other.

2. The processing apparatus as claimed in claim 1, wherein said placement stage is disk-shaped, and said plurality of areas are concentric areas divided in a radial direction of the placement stage, and the heaters embedded in an outer area and the heaters embedded in an inner area of adjacent areas of the concentric areas have parts that alternately enter in a vicinity of a boundary between the outer area and the inner area.

3. The processing apparatus as claimed in claim 1, wherein said placement stage is made of a ceramic material, and said heaters are made of a resistance heating metal of a linear-shape or coil-shape.

4. The processing apparatus as claimed in claim 3, wherein said ceramic material is selected from the group consisting of AlN, $Al_2O_3$, SiC and $SiO_2$.

5. The processing apparatus as claimed in claim 3, wherein said heaters are printed pattern heaters.

6. The processing apparatus as claimed in claim 3, wherein said resistance heating metal is a metal selected from the group consisting of elementary substances of molybdenum, vanadium, chrome, manganese, niobium, tantalum, nickel, tungsten and an alloy of the aforementioned.

7. A heater unit for heating an object to be processed, wherein the heater unit has a plurality of areas and a heater is independently embedded in each of the plurality of areas, and said heater embedded in one of adjacent areas has a part extending in the other of the adjacent areas, and said heater embedded in the other of the adjacent areas has a part extending in said one of the adjacent areas and wherein at least a part of the two heaters in said adjacent areas extend by reciprocating between said adjacent areas while maintaining a positional relationship so as to be close to but not in contact with each other.

8. The heating unit as claimed in claim 7, wherein said plurality of areas are concentric areas divided in a radial direction and the heaters embedded in an outer area and the heaters embedded in an inner area of adjacent areas of the concentric areas have parts that alternately enter in a vicinity of a boundary between the outer area and the inner area.

9. The heater unit as claimed in claim 7, wherein said heaters are made of a resistance heating metal of a linear-shape or coil-shape.

10. The heater unit as claimed in claim 7, wherein said heaters are printed pattern heaters.

11. The heater unit as claimed in claim 9, wherein said resistance heating metal is a metal selected from the group consisting of elementary substances of molybdenum, vanadium, chrome, manganese, niobium, tantalum, nickel, tungsten and an alloy of the aforementioned.

* * * * *